(12) United States Patent
Chuang et al.

(10) Patent No.: US 11,647,592 B2
(45) Date of Patent: May 9, 2023

(54) EXPOSURE SYSTEM, CIRCUIT BOARD, AND METHOD FOR MAKING CIRCUIT BOARD

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Ching-Lung Chuang, New Taipei (TW); I-Hsin Chen, New Taipei (TW); Li-Jen Chang, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 137 days.

(21) Appl. No.: 17/238,838

(22) Filed: Apr. 23, 2021

(65) Prior Publication Data

US 2022/0312599 A1    Sep. 29, 2022

(30) Foreign Application Priority Data

Mar. 25, 2021   (CN) .......................... 202110322426.9

(51) Int. Cl.
*H05K 3/34* (2006.01)
*H05K 3/28* (2006.01)
*H05K 1/11* (2006.01)
*G02F 1/13357* (2006.01)

(52) U.S. Cl.
CPC .......... *H05K 3/3452* (2013.01); *H05K 1/111* (2013.01); *H05K 3/282* (2013.01); *G02F 1/133603* (2013.01); *H05K 2201/0989* (2013.01); *H05K 2201/10106* (2013.01); *H05K 2203/0514* (2013.01); *H05K 2203/10* (2013.01)

(58) Field of Classification Search
CPC ..................................................... H05K 3/3452
USPC ......................................................... 174/262
See application file for complete search history.

(56) References Cited

U.S. PATENT DOCUMENTS

| 10,029,485 | B2* | 7/2018 | Kagose | ................ C09D 11/322 |
|---|---|---|---|---|
| 2008/0116272 | A1* | 5/2008 | Giering | ................ G07D 7/1205 |
|  |  |  |  | 235/491 |
| 2012/0103217 | A1* | 5/2012 | Stowe | ....................... B41F 7/00 |
|  |  |  |  | 101/423 |
| 2018/0178247 | A1* | 6/2018 | Aizawa | ................... H01L 33/62 |
| 2022/0004122 | A1* | 1/2022 | Orlik | .................. G03G 15/2007 |

FOREIGN PATENT DOCUMENTS

TW          I613076          2/2018

\* cited by examiner

*Primary Examiner* — Stanley Tso
(74) *Attorney, Agent, or Firm* — ScienBiziP, P.C.

(57) ABSTRACT

A system for effectively curing dry film ink throughout its thickness on circuit boards being made applies an exposure system, a circuit board, and a method for making the circuit board. The exposure system includes a plurality of mixed light sources with different wavelengths within a range of 365 nm to 440 nm, the mixed light sources can output at least three different wavelengths of light each of substantially a single wavelength and a fourth source of light able to output light of a spectrum of wavelengths, the ranges of light being between 365 nm and 440 nm.

9 Claims, 9 Drawing Sheets

EXPOSURE SYSTEM, CIRCUIT BOARD, AND METHOD FOR MAKING CIRCUIT BOARD

FIELD

The subject matter herein generally relates to circuit board manufacture, specifically an exposure system, a circuit board, and a method for making the circuit board.

BACKGROUND

Generally, a circuit board includes a circuit layer and a solder resist layer covering the circuit layer. The solder resist layer may be a patterned dry film ink. However, when the dry film ink is to be exposed and cured, the bottom of the ink may not be completely cured, resulting in serious undercut. In addition, the residual liquid in the undercut may become dangerous due to subsequent processes, causing the circuit board to explode.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one".

Figure 1:
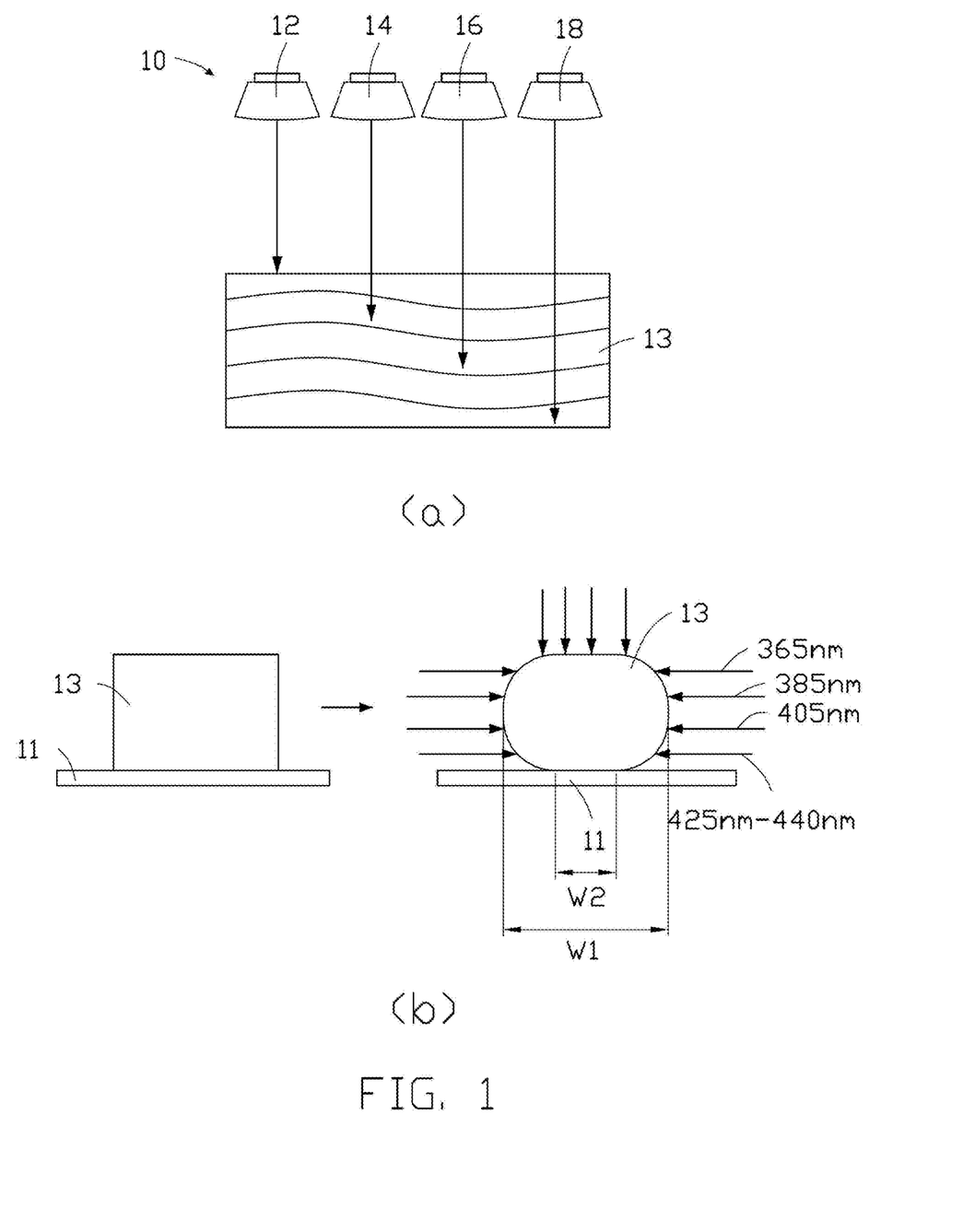
FIG. 1 is a schematic diagram of a working principle of an exposure system according to an embodiment of the present disclosure.

FIG. 1 shows a working principle of an exposure system according to an embodiment. As shown in diagram (a) of FIG. 1, the exposure system 10 includes a plurality of light sources for emitting light of different wavelengths within the range of 365 nm to 440 nm. The light sources of the exposure system 10 can output light of at least four different wavelengths, three of such wavelengths being substantially of a single wavelength, and the fourth light source emitting a spectrum of light, within the range of 425 nm to 440 nm.

The exposure system 10 can use light of at least four different wavelengths in the range of 365 nm to 440 nm to expose and cure a dry film ink 13. Short-wavelength light (e.g., light with a wavelength in a range of 365 nm to 425 nm) is good for curing surface of the dry film ink 13, and long-wavelength light (e.g., light with a wavelength in a range of 425 nm to 440 nm) is effective for curing the interior and bottommost part of the dry film ink 13. Therefore, the light output by the light sources is in the range of 365 nm to 440 nm, which can penetrate a surface portion of the dry film ink 13 and act on the inner and deep portions of the dry film ink 13. Thus, the bottom portion of the ink 13 is not susceptible to being washed away by developer fluid during a subsequent development process, which avoids undercutting caused by incomplete curing of the bottom portion of the dry film ink 13. Furthermore, when the dry film ink 13 is patterned and used as a solder resist, the solidity of being in non-liquid form avoids erosion of the sides, shrinkage of a gap is less, and risk of circuit board explosion caused by residual liquid in gaps during subsequent processes is reduced.

Some conventional exposure systems use mixed light sources, their wavelengths of light emitted by the mixed light sources are in a range of 320 nm to 400 nm. Since absorption rate of dry film ink to light (especially UV light band) is affected by the wavelength of the light source, and more energy is absorbed near the surface of the ink, while the deeper the ink (also called the bottom portion of the ink) gets less energy. This becomes an acute problem as the thickness or depth of ink increases. This situation varies with the wavelength range of the light sources. The wavelength range of the light sources of the traditional exposure system is 320 nm to 400 nm, and this can only reach the ink depth of about 30 μm at most. When the ink thickness is greater than 30 μm, 320 nm to 400 nm light cannot reach the bottom portion of the ink at all, making the curing of the bottom layer incomplete. During exposure, the surface portion of the ink is cured more fully than the bottom portion. In the development step, when washing with a developer, the weakly cured bottom portion has a weaker bond with the substrate 11, and side erosion occurs, so that a width of the bottom portion is undercut and is less than a width of the surface portion. A cross-section of the patterned dry film ink along the thickness direction of the patterned ink is generally of an inverted trapezoid shape. Therefore, the shrinkage of the patterned dry film ink is relatively large (greater than 45 μm), which tends to hide the liquid in the subsequent process and affect quality of the circuit board with the patterned dry film ink as a solder mask layer.

In some embodiments, the mixed light sources of the exposure system 10 include one or a combination of a light source 12 for emitting light of a single wavelength of 365 nm, a light source 14 for emitting light of a single wavelength of 385 nm, and a light source 16 for emitting light of a single wavelength of 405 nm. The light sources 12, 14, 16, and 18 may all be LEDs. In other embodiments, the light sources 12, 14, 16, and 18 may all be laser light sources.

As shown in diagram (a) of FIG. 1, the mixed light sources of the exposure system 10 include four light sources, which are light sources 12, 14, 16, and 18. Short-wavelength light (e.g., 365 nm) can reach the surface portion of the dry film ink 13, and as the wavelength of the light source increases, the depth to which irradiate the dry film ink 13 is increased. The light source 14 with a wavelength of 385 nm and the light source 16 with a wavelength of 405 nm can reach the middle portion of the dry film ink 13. The light source 16 of a wavelength of 405 nm can reach the ink depth of about 30 μm, and the light source 18 of a wavelength in the range of 425 nm to 440 nm can reach the deep portion (more than 30 μm) of the dry film ink 13. Therefore, in the exposure system 10, the wavelengths of the output light are in the range of 365 nm to 440 nm, which can penetrate not only the surface portion of the dry film ink 13 but further act on the inner and deeper portions (more than 30 μm) of the dry film ink 13.

As shown in diagram (b) of FIG. 1, after the dry film ink 13 is exposed and developed, since light with a wavelength in the range of 425 nm to 440 nm can reach the deep portion of the dry film ink 13, the bottom of the ink is not easily washed away by the developer, which avoids the problem of undercutting caused by incomplete curing of the bottom portion of the film ink 13. A cross-section of the side wall of the patterned dry film ink 13 in the thickness direction is a convex arc in shape, like a bullet. In other words, after being patterned, the dry film ink 13 has a "U"-shaped side wall that is inclined at 90°. As shown in diagram (b) of FIG. 1, a width at the widest position of the patterned dry film ink 13 is W1, and a width at the narrowest position of the patterned dry film ink 13 is W2. An undercutting, in terms of distance, is defined as half of a width difference between the widest position and the narrowest position of patterned dry film ink 13. That is, the undercut distance is (W1−W2)/2. Since the dry film type ink 13 has less shrinkage after being patterned (i.e., W2 increases), the undercut distance decreases. Therefore, compared with the inverted trapezoidal cross-section, the patterned dry film ink 13 has less shrinkage after being patterned. Therefore, when the patterned dry film ink 13 is used as a solder mask layer of the circuit board, the risk of malformations of the circuit board and other dangers of a hidden liquid in the gaps during the subsequent process is reduced.

In addition, the exposure system 10 may further include a controller (not shown) and optical elements such as a mirror (not shown). The controller controls time sequence of the light emitted by the mixed light sources. In one embodiment, during the exposure process, the controller controls the mixed light sources to irradiate the dry film ink 13 in the order of wavelengths from longest to shortest. For example, the controller controls the mixed light sources to first use the light source 18 with a wavelength in the range of 425 nm to 440 nm to irradiate the dry film ink 13, so that the light with the wavelength in the range of 425 nm to 440 nm penetrates the surface portion of the dry film ink 13 and acts on the deepest, the deeper, and the inner portions of the dry film ink 13 (more than 30 μm). After the dry film ink 13 absorbs the energy of light with a wavelength of 425 nm to 440 nm, its curing strength on the substrate 11 is effectively higher. That is, the deep inside of the dry film ink 13 is cured by light with a wavelength in the range of 425 nm to 440 nm, so that the dry film ink 13 will not easily be detached from the substrate 11 during the subsequent development process, which is beneficial to improve the gloss of the dry film ink 13 after being patterned. Then, the control system controls the mixed light sources to irradiate the dry film ink 13 with the light source 16 with a wavelength of 405 nm, then the light source 14 with a wavelength of 385 nm and the light source 12 with a wavelength of 365 nm in sequence to act on the surface portion and the inner middle portion of the dry film ink 13, to further solidify the surface and inner middle portions of the dry film ink 13.

In addition, the controller can further control an energy ratio of the light emitted by each light source in the at least four different wavelengths of light in the combined light source, so that the dry film ink 13 achieves a better curing effect.

Figure 2:
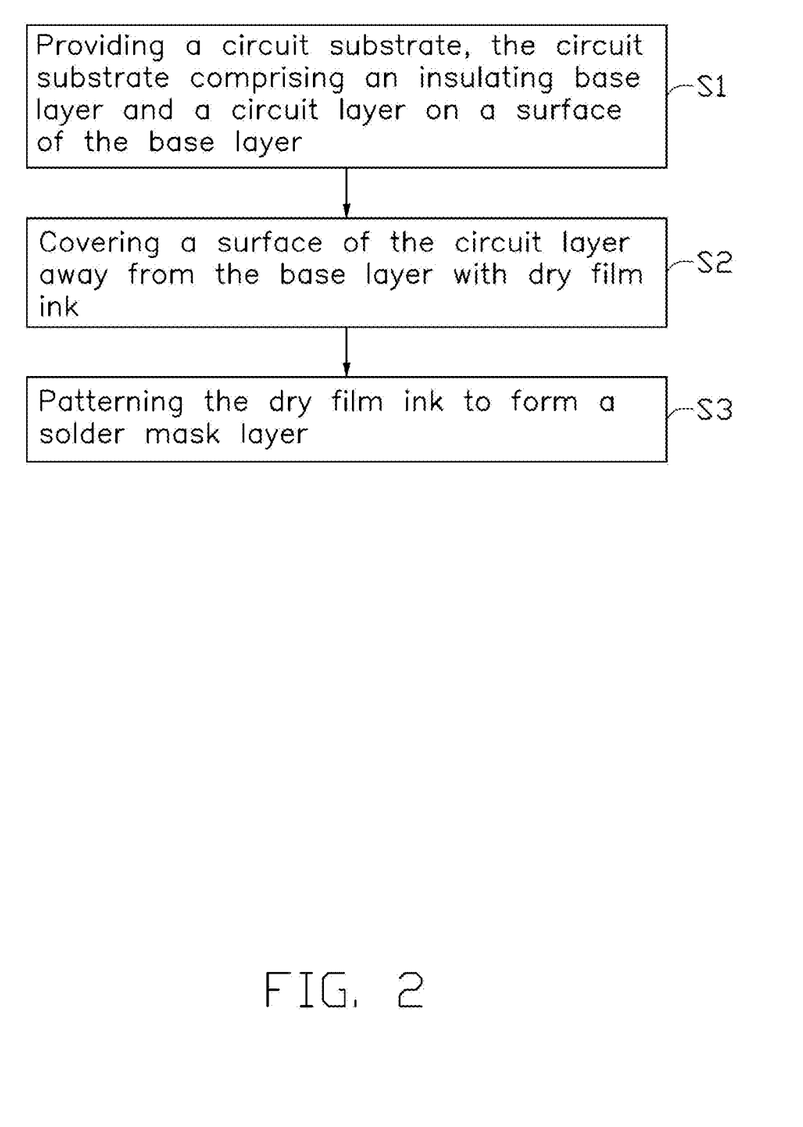
FIG. 2 is a schematic flow chart of a method for making a circuit board applying the exposure system in FIG. 1 according to an embodiment of the present disclosure.

FIG. 2 shows a flowchart of a method for a circuit board according to an embodiment. The example method is provided by way of example, as there are a variety of ways to carry out the method. The method described below can be carried out using the configurations illustrated in FIGS. 3 through 7, for example, and various elements of these figures are referenced in explaining the example method. Each block shown in FIG. 2 represents one or more processes, methods, or subroutines carried out in the example method. Furthermore, the illustrated order of blocks is by example only, and the order of the blocks can be changed. Additional blocks can be added, or fewer blocks can be utilized, without departing from this disclosure. The example method can begin at block S1.

Block S1: a circuit substrate is provided, wherein the circuit substrate includes an insulating base layer and a circuit layer on a surface of the base layer.

Block S2: a surface of the circuit layer away from the base layer is covered with dry film ink.

Block S3: the dry film ink is patterned to form a solder mask layer.

The method for making the circuit board will be described in detail below with reference to FIGS. 3 through 7.

Figure 3:
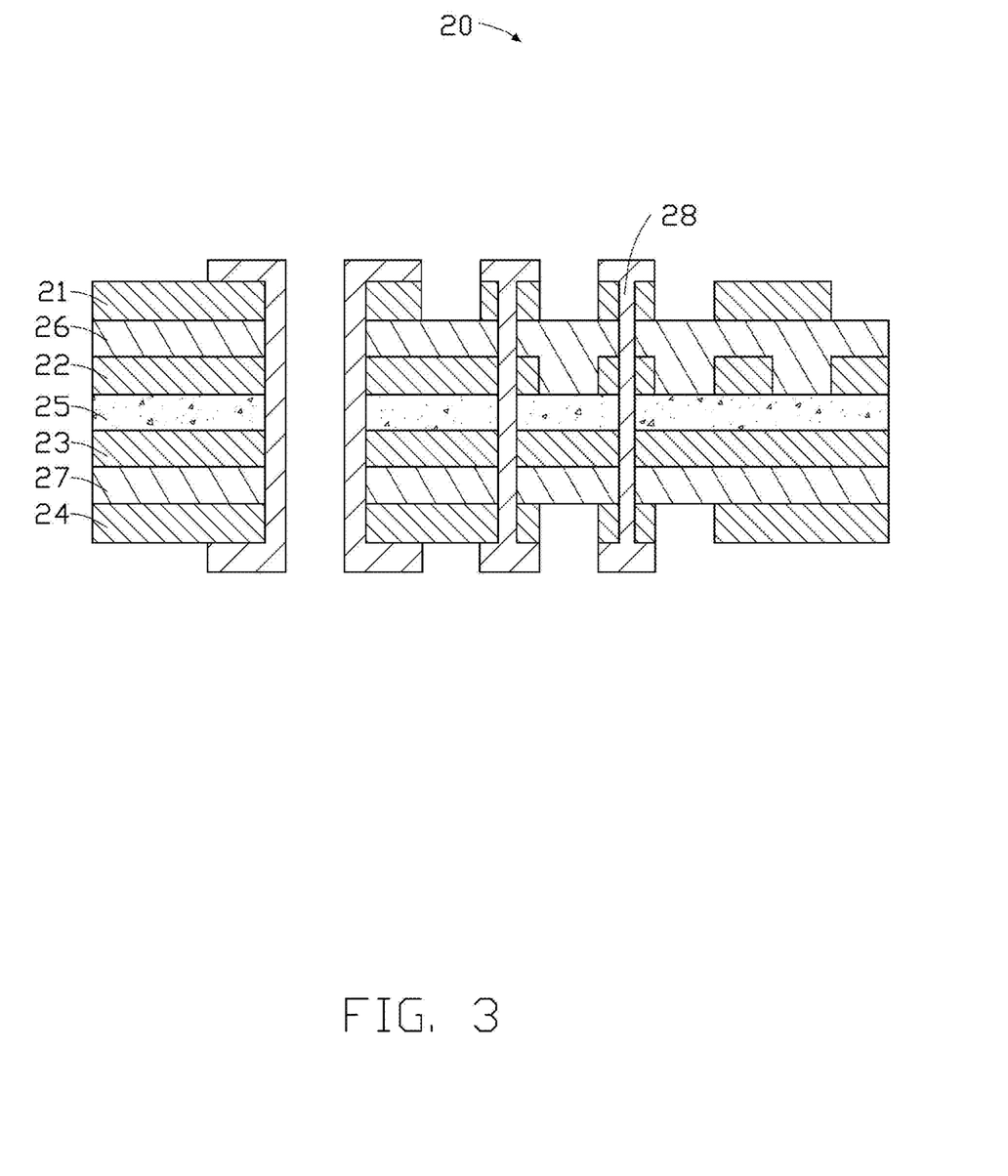
FIG. 3 is a cross-sectional view of a circuit substrate in block S1, created in the method of FIG. 2.

Block S1: a circuit substrate is provided, wherein the circuit substrate includes an insulating base layer and a circuit layer on a surface of the base layer.

As shown in FIG. 3, the circuit substrate 20 includes four circuit layers, one dielectric layer, and two layers of build-up materials. In order from top to bottom, the circuit substrate 20 includes a first circuit layer 21, a first build-up material 26, a second circuit layer 22, a dielectric layer 25, a third circuit layer 23, a second build-up material 27, and a fourth circuit layer 24. The insulating base layer in block S1 is the first build-up material 26, and the circuit layer on the surface of the base layer in block S1 is the first circuit layer 21. The first circuit layer 21, the second circuit layer 22, the third circuit layer 23 and the fourth circuit layer 24 are electrically connected by conductive holes 28 penetrating the first build-up material 26, the dielectric layer 25, and the second build-up material 27. In other embodiments, the circuit substrate 20 is not limited to include four circuit layers, it may include one circuit layer, or two, three, and more than four circuit layers.

Figure 4:
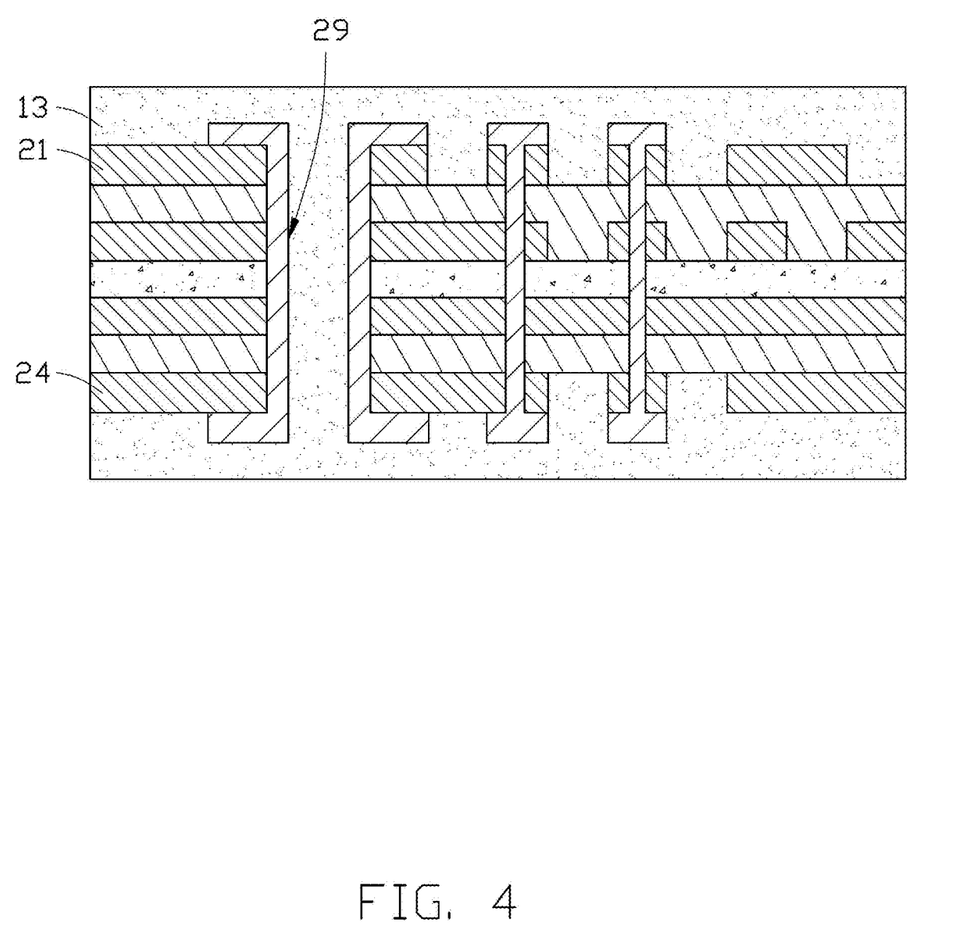
FIG. 4 is a cross-sectional view showing dry film ink covering a surface of the circuit layer away from the base layer in FIG. 3.

Block S2: a surface of the circuit layer away from the base layer is covered with dry film ink.

As shown in FIG. 4, the dry film ink 13 covers the surface of the first circuit layer 21, infills a through hole 29 penetrating the first build-up material 26, the dielectric layer 25, and the second build-up material 27 and covers the surface of the fourth circuit layer 24. That is, both the first circuit layer 21 and the fourth circuit layer 24 are covered with the dry film ink 13. In other embodiments, forming the dry film ink covering the surface of the fourth circuit layer 24 and forming the dry film ink covering the surface of the first circuit layer 21 are two separate processes.

In one embodiment, a thickness of the portion where the dry film ink 13 covers the first circuit layer 21 is in a range of 30 µm to 60 µm.

Figure 5:
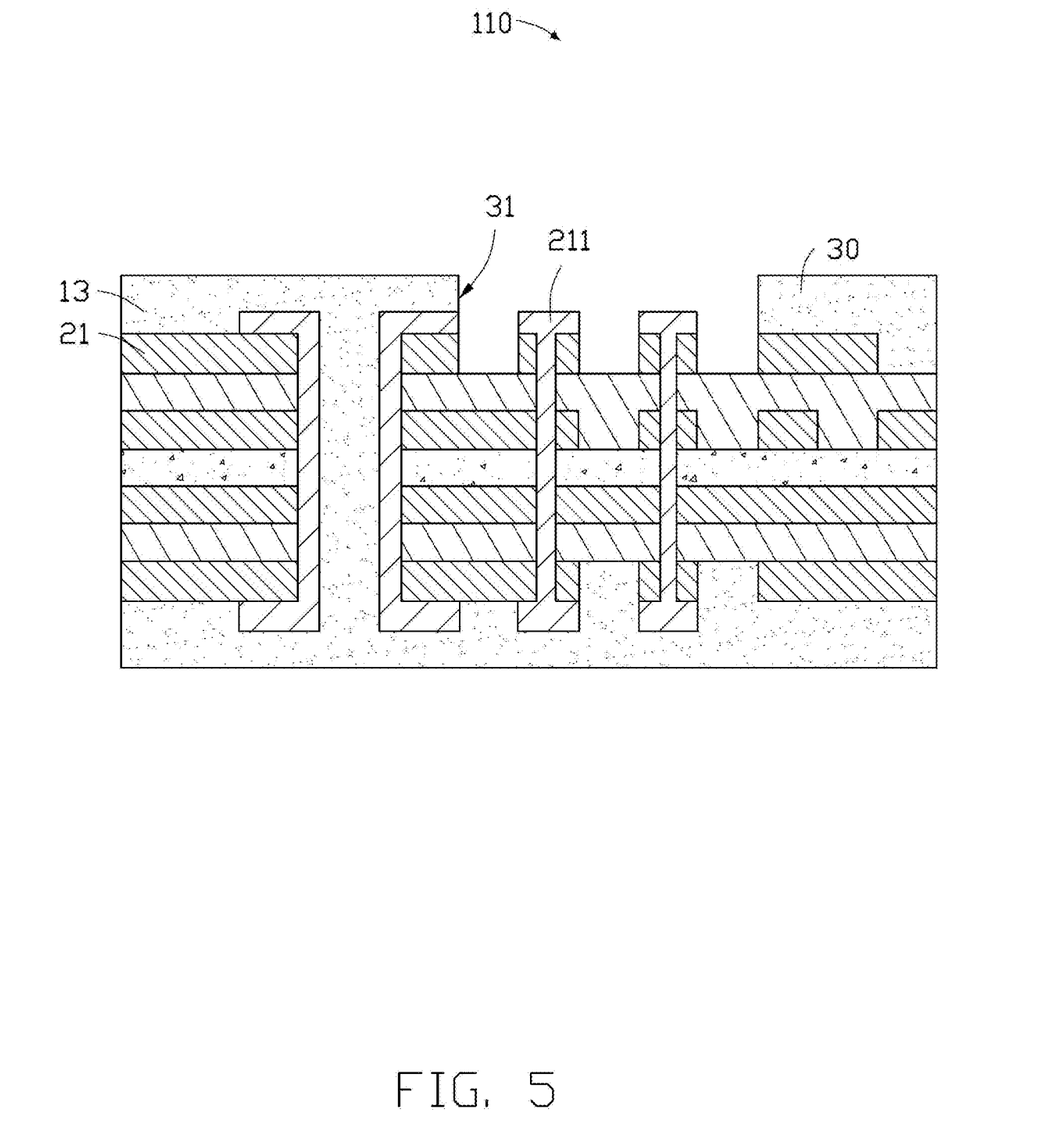
FIG. 5 is a cross-sectional view showing a solder mask layer obtained by patterning the dry film ink in FIG. 4.

Block S3: the dry film ink is patterned to form a solder mask layer.

Patterning the dry film ink 13 to form the solder mask layer 30 includes exposure, development, and post-curing. In the exposure step, at least four different wavelengths of light with a wavelength range of 365 nm to 440 nm irradiates the dry film ink 13 in the order of wavelength from long to short, and the light of at least four different wavelengths includes light of a wavelength in a range of 425 nm to 440 nm. Thus, the deep portion, the inner middle portion, and the surface portion of the dry film ink 13 can all be irradiated. In some embodiments, the light of at least four different wavelengths includes light with a single wavelength of 365 nm, light with a single wavelength of 385 nm, and light with a single wavelength of 405 nm, and light with a wavelength of 425 nm to 440 nm, light with a single wavelength of 365 nm. In the light of at least four different wavelengths, energy ratios of light of a wavelength in a range of 425 nm to 440 nm, light of a single wavelength of 365 nm, light of a single wavelength of 385 nm, and light of a single wavelength of 405 nm are defined as a, b, c, d, respectively; where $0<a\leq36\%$, $0<b\leq25\%$, $0<c\leq15\%$, and $0<d\leq24\%$. Thus, by adjusting the energy ratios of the light emitted by the mixed light sources with the light of different wavelengths, the dry film ink 13 achieves a good curing effect.

In addition, since the deep portion, inner middle portion, and surface portion of the dry film ink 13 can be irradiated during the exposure step of the method for making the circuit board, it has a better curing effect. Therefore, after exposure, the development step can be directly performed without pre-baking. Thus, the pre-baking step after the exposure process is eliminated, the process is simplified, and the production efficiency is improved.

As shown in FIG. 5, after development and post-curing, a portion of the dry film ink 13 covering the first circuit layer 21 is patterned to form a slot 31 exposing the first circuit layer 21. The exposed portion of the first circuit layer 21 forms a solder pad 211. The solder mask layer 30 includes a side wall 32 at the slot 31.

Figure 6:
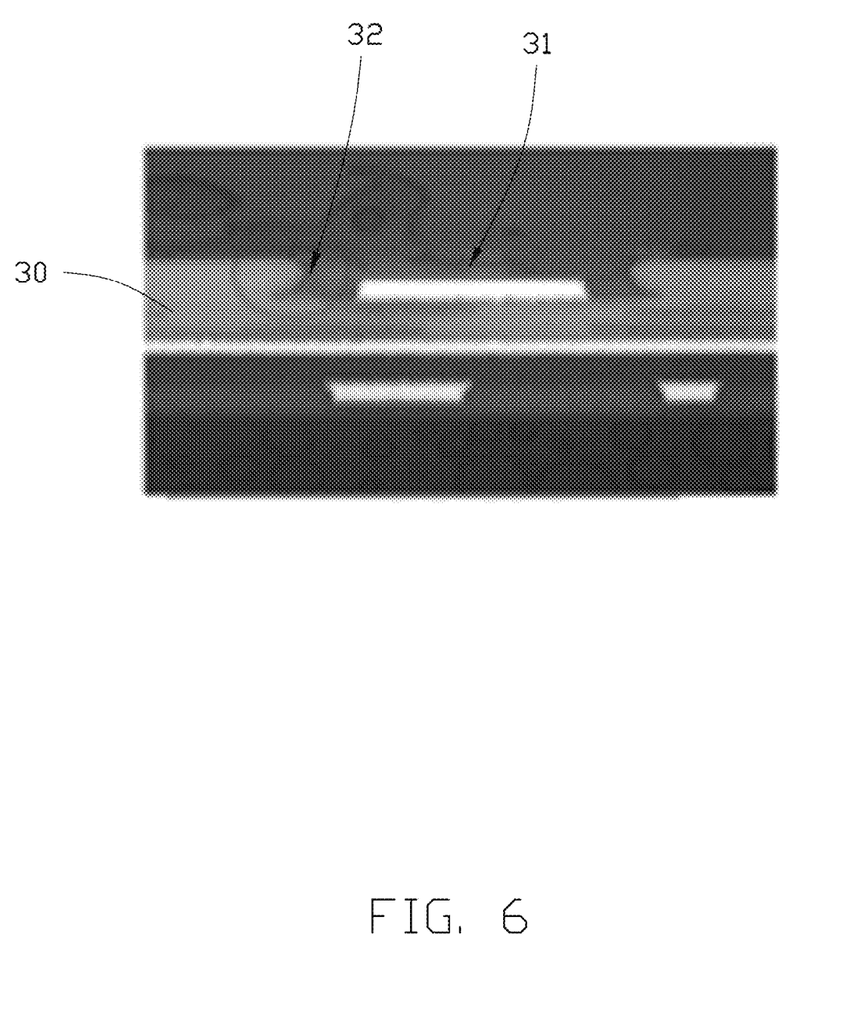
FIG. 6 is a cross-sectional view showing a slot of the solder mask layer in FIG. 5.

As shown in FIG. 6, along a thickness direction of the solder mask layer 30, a cross section of the side wall 32 is a convex arc in-shape facing the slot 31. Compared with the traditional inverted trapezoidal cross-section, the dry film ink 13 has less shrinkage after being patterned. Therefore, when the patterned dry film ink 13 is used as a solder mask layer of the circuit board, risk of the circuit board explosion due to the residual liquid in gaps during subsequent processes is reduced.

In some embodiments, after the dry film ink 13 is patterned, the undercut distance at the slot 31 is less than 45 µm. Therefore, compared with the traditional inverted trapezoidal cross-section, the dry film ink 13 has less shrinkage after being patterned, which can effectively reduce the length of gap when the patterned dry film ink 13 is used as the solder mask layer 30 of the circuit board, risk of the circuit board explosion due to the residual liquid in gaps during subsequent processes is reduced.

Figure 7:
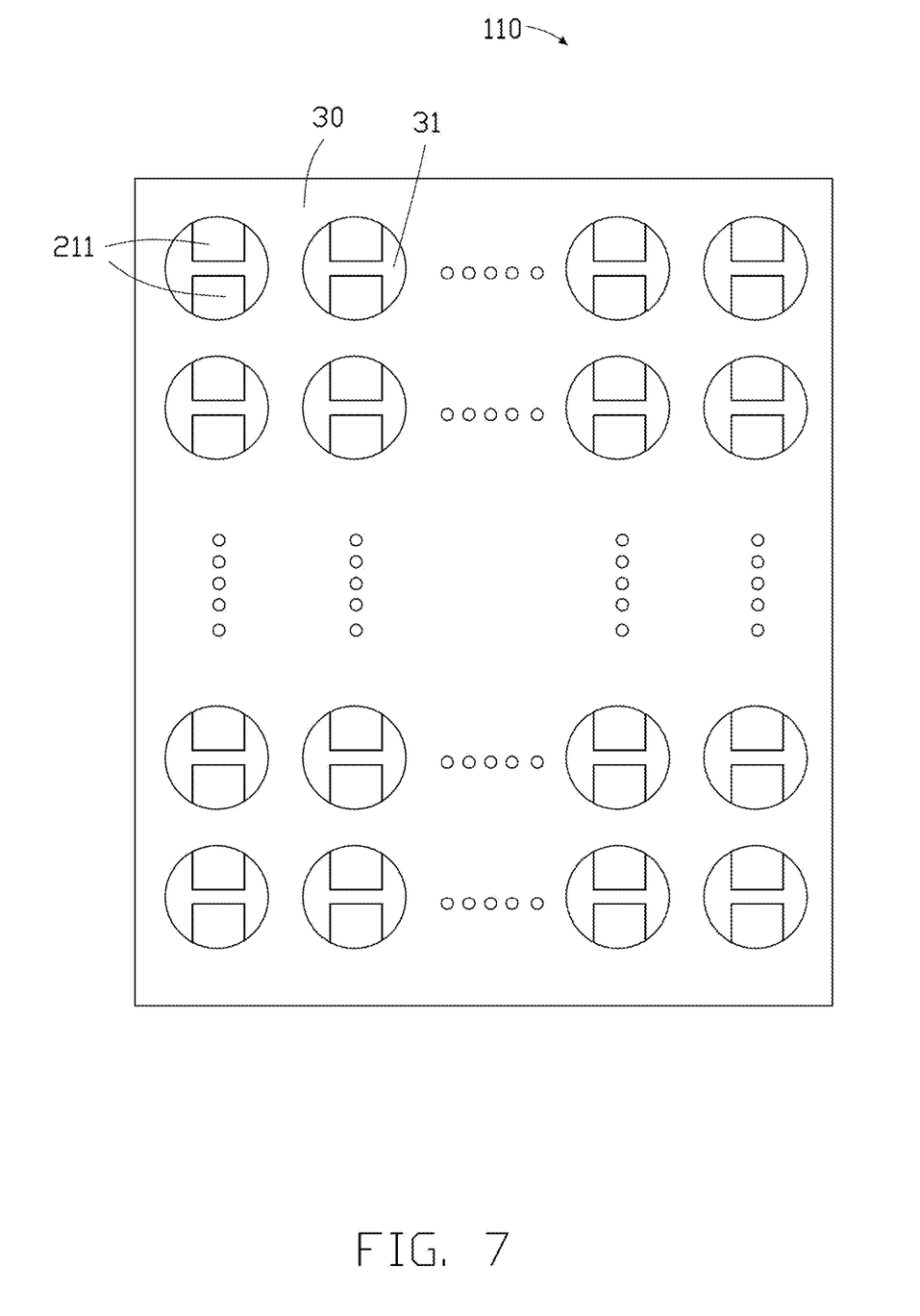
FIG. 7 is a top view of the circuit board in FIG. 5.

FIG. 7 shows a top view of the circuit board shown in FIG. 5. The slots 31 opened in the solder mask layer 30 are arranged in a matrix including rows and columns. Each slot 31 exposes two solder pads 211. The two solder pads 211 are spaced apart from each other for connection with an external circuit (such as an LED chip).

An embodiment of the present disclosure provides a circuit board 110 shown in FIGS. 5 and 7. The circuit board 110 includes an insulating base layer, a circuit layer formed on the surface of the base layer, and a solder mask layer 30. The solder mask layer 30 covers the surface of the circuit layer away from the base layer, the solder mask layer 30 has slots 31 exposing the circuit layer, and each exposed portion of the circuit layer forms a solder pad 211. The solder mask layer 30 is a patterned dry film type ink 13, the solder mask layer 30 includes a side wall 32 at the slot 31, and in the thickness direction of the solder mask layer 30, the cross section of the side wall 32 is a convex arc in-shape facing the slot 31. The thickness of the solder mask layer 30 is 30 µm to 60 µm. The undercut distance of the patterned dry film ink 13 at the slot 31 is less than 45 µm. In other embodiments, the circuit board 110 is not limited to having four circuit layers. The cross section of the side wall 32 of the solder mask layer 30 of the circuit board 110 is a convex arc in-shape facing the slot 31. That is, the solder mask layer 30 has a side wall like a bullet structure, or a "U"-shaped side wall with a similar slope of 90°. Therefore, the problem of undercutting is avoided, so that the shrinkage of the solder mask layer 30 is less, which can effectively reduce the risk of circuit board explosion caused by the circuit board 110 due to the liquid hidden in gaps in the subsequent manufacturing process.

Figure 8:
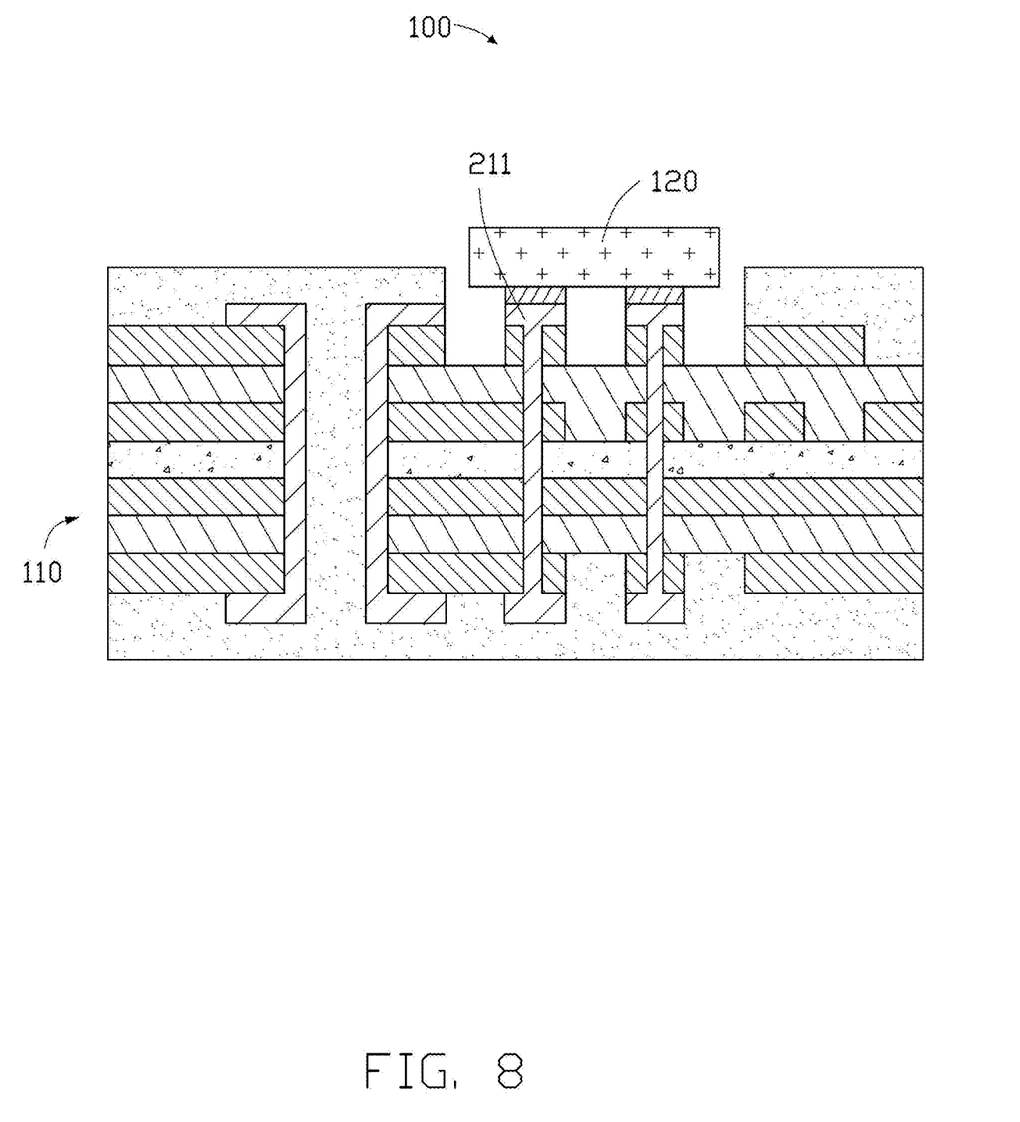
FIG. 8 is a cross-sectional view showing a backlight board obtained by connecting a light-emitting element to the solder pad of FIG. 7.

As shown in FIG. 8, an embodiment of the present disclosure provides a backlight module 100. The backlight module 100 includes at least one light-emitting element 120 and the circuit board 110. The light-emitting element 120 is on the solder pads 211 and electrically connected to the solder pads 211. In some embodiments, the light-emitting element 120 is a mini-LED with a size range of approximately 50 µm to 200 µm.

In some embodiments, the distance between two adjacent mini-LEDs is in a range from 0.1 mm to 1.0 mm. That is, the distance between two adjacent exposed portions of the circuit layer is in a range from 0.1 mm to 1.0 mm. Thus, the number of mini-LEDs increases, and the arrangement of mini-LEDs is dense, so that when the backlight module 100 is used in a display device, the display device has a high contrast, a good color gamut, and a fine area light control effect to achieve a high dynamic range image.

Figure 9:
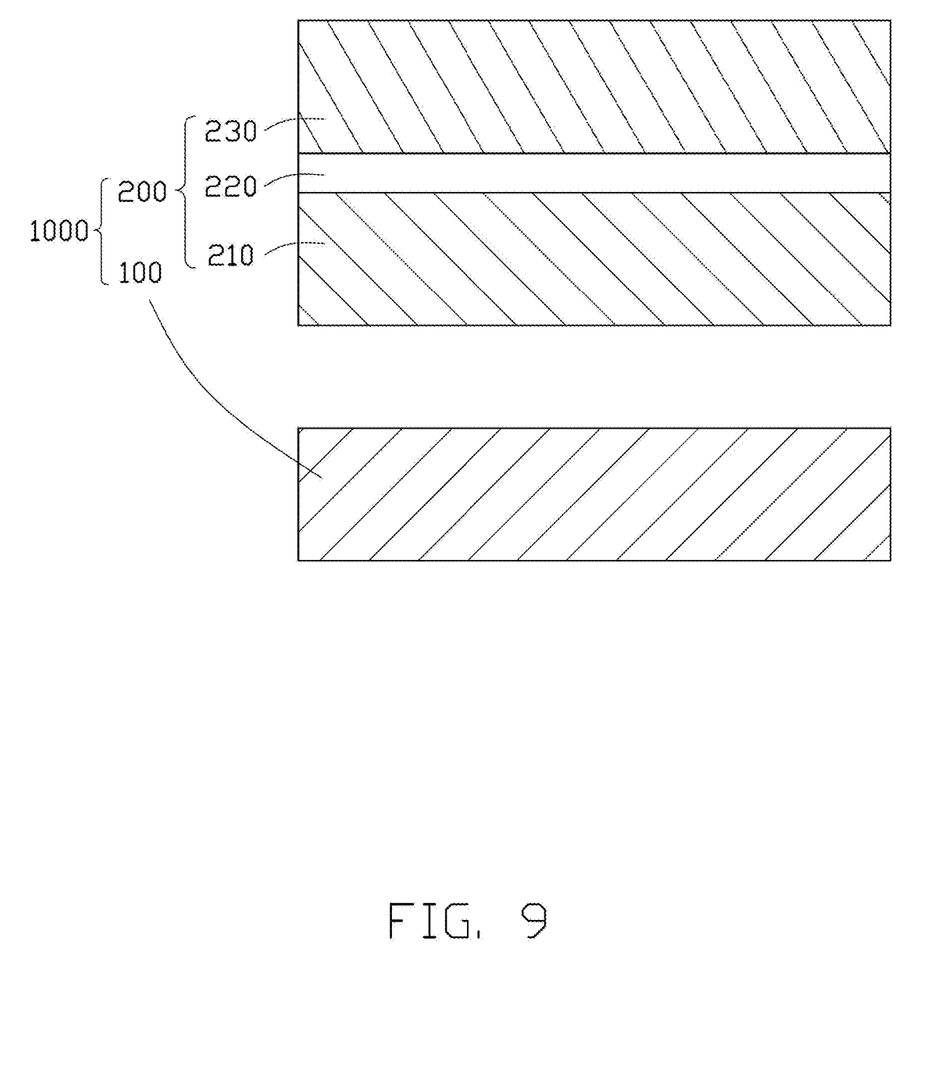
FIG. 9 is a cross-sectional view of a display device according to the present disclosure applying the backlight board in FIG. 8.

As shown in FIG. 9, an embodiment of the present disclosure provides a display device 1000. The display device 1000 includes a display panel 200 and the backlight module 100. The display panel 200 and the backlight module 100 is stacked. The display panel 200 is a liquid crystal display panel, which includes a color filter substrate 230, a liquid crystal layer 220, and a thin film transistor array substrate 210 that are sequentially stacked. The backlight plate 100 serves as a direct type of backlight source and is on a side of the display panel 200 away from the display surface to provide backlight for the display panel 200. In addition, the backlight module 100 further includes optical films such as brightness enhancement films, diffusion sheets, light guide plates, and reflection sheets that are laminated.

In some embodiments, the display device 1000 may be an outdoor display screen, a TV, a notebook computer, a tablet computer, a car touch screen, etc. Since the display device 1000 includes the backlight module 100, it also has the advantage of good reliability.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for making a circuit board, comprising:
providing a circuit substrate, wherein the circuit substrate comprises a base layer and a circuit layer on a surface of the base layer, and the base layer is electrically insulating;
covering a surface of the circuit layer away from the base layer with dry film ink; and
patterning the dry film ink to form a solder mask layer, wherein the solder mask layer defines a slot exposing a portion of the circuit layer, an exposed portion of the circuit layer forms a solder pad, the solder mask layer comprises a sidewall at the slot, and a cross section of the side wall along a thickness direction of the solder mask layer is a convex arc in shape facing the slot;
wherein the dry film ink is patterned by irradiating the dry film ink with light of at least four different wavelengths in a range of 365 nm to 440 nm in an order from long wavelength to short wavelength, and the light of at least four different wavelengths comprises light of a wavelength in a range of 425 nm to 440 nm.

2. The method for making the circuit board of claim 1, wherein the light of at least four different wavelengths further comprise at least one of the following: light of a single wavelength of 365 nm, light of a single wavelength of 385 nm, and light of a single wavelength of 405 nm.

3. The method for making the circuit board of claim 2, wherein in the light of at least four different wavelengths, energy ratios of light of a wavelength in a range of 425 nm to 440 nm, light of a single wavelength of 365 nm, light of a single wavelength of 385 nm, and light of a single wavelength of 405 nm are defined as a, b, c, d, respectively; where $0<a\leq36\%$, $0<b\leq25\%$, $0<c\leq15\%$, and $0<d\leq24\%$.

4. The method for making the circuit board of claim 2, wherein a thickness of the dry film ink is in a range of 30 μm to 60 μm.

5. The method for making the circuit board of claim 2 further comprising directly developing the dry film ink after the dry film ink is patterned, without pre-baking.

6. The method for making the circuit board of claim 2, wherein an undercutting, in terms of distance, is defined as half of a width difference between a widest position and a narrowest position of a patterned dry film ink at the slot, and the method further comprising controlling the undercutting to be less than 45 μm.

7. The method for making the circuit board of claim 2, wherein the circuit substrate comprises at least two circuit layers, the at least two circuit layers are on opposite surfaces of the base layer and are electrically connected by conductive holes penetrating the base layer.

8. The method for making the circuit board of claim 7, wherein the solder mask layer comprises a plurality of the slots, the exposed portion of the circuit layer by one of the slots forms two solder pads spaced apart from each other, and the two solder pads are configured to be electrically connected to an external circuit.

9. The method for making the circuit board of claim 8, wherein a distance between two adjacent exposed portions of the circuit layer is in a range from 0.1 mm to 1.0 mm.

* * * * *